United States Patent [19]
Brady et al.

[11] Patent Number: 5,106,786
[45] Date of Patent: Apr. 21, 1992

[54] THIN COATINGS FOR USE IN SEMICONDUCTOR INTEGRATED CIRCUITS AND PROCESSES AS ANTIREFLECTION COATINGS CONSISTING OF TUNGSTEN SILICIDE

[75] Inventors: Michael F. Brady, Morrisville, Pa.; Aubrey L. Helms, Jr., Pennington, N.J.

[73] Assignee: AT&T Bell Laboratories, Murray Hill, N.J.

[21] Appl. No.: 425,134

[22] Filed: Oct. 23, 1989

[51] Int. Cl.$^5$ .................... H01L 21/00; H01L 21/02; H01L 21/88
[52] U.S. Cl. .................... 437/229; 437/200; 437/225; 148/DIG. 137; 148/DIG. 147; 430/275; 430/276; 430/311; 430/313
[58] Field of Search ............... 437/225, 228, 229, 196, 437/197, 200; 148/DIG. 137, DIG. 147; 430/270, 275, 276, 311, 312, 313

[56] References Cited

U.S. PATENT DOCUMENTS

| | | | |
|---|---|---|---|
| 4,398,341 | 8/1963 | Geipel, Jr. et al. | 29/578 |
| 4,640,001 | 2/1987 | Koiwai et al. | 29/572 |
| 4,820,611 | 4/1989 | Arnold, III et al. | 430/271 |

FOREIGN PATENT DOCUMENTS

0047951  2/1988  Japan.

OTHER PUBLICATIONS

"Fundamentals of Sputtering", by A. J. Aronson, *Microelectronic Manufacturing and Testing*, Jan. 1987, Part I pp. 22-23, Part II. pp. 27-28.

"Antireflection Coatings on Metal Layers for Photolithographic Purposes", by H. A. M. van den Berg et al., *Journal of Applied Physics*, vol. 50, No. 3, Mar. 1979, pp. 1212-1214.

"Sputtered Metallizations for Hybrid Devices", by R. P. Maniscalco et al., *Hybrid Circuit Technology*, Sep. 1984, pp. 19-23.

"Reactive Sputter Deposition: A Quantitative Analysis", by D. K. Hohne et al., *Thin Solid Films*, Elsevier Sequoia, vol. 118, (1984), pp. 301-310.

*Primary Examiner*—Brian E. Hearn
*Assistant Examiner*—B. Everhart
*Attorney, Agent, or Firm*—R. B. Anderson

[57] ABSTRACT

An antireflection coating (21) for use in integrated circuit processing consists of a film of tungsten silicide ($WSi_{0.45}$) or tungsten silicon nitride (WSiN). These coatings are preferably made by sputtering, with the tungsten silicon nitride coating being made by sputtering in a nitrogen-containing atmosphere.

2 Claims, 3 Drawing Sheets

THIN COATINGS FOR USE IN SEMICONDUCTOR INTEGRATED CIRCUITS AND PROCESSES AS ANTIREFLECTION COATINGS CONSISTING OF TUNGSTEN SILICIDE

TECHNICAL FIELD

This invention relates to thin coatings and, more particularly, to antireflection coatings used in processes for making semiconductor integrated circuits.

BACKGROUND OF THE INVENTION

One step in the fabrication of semiconductor integrated circuits is the formation of a conductor pattern over a semiconductor substrate through photolithographic masking and etching. This step typically requires the formation of a continuous sheet of metal film that is insulated from the substrate by a dielectric layer. A photoresist coating over the metal layer is selectively exposed to actinic light through a mask which defines the desired conductor pattern. The photoresist film is developed so that it in turn constitutes a mask having openings defining the desired conductor pattern. Modern integrated circuit techniques then often employ reactive ion etching for selectively etching away the exposed metal to the dielectric layer, and after that, removal of the remaining photoresist leaves the desired conductor pattern overlying the dielectric layer.

Trends toward increased circuit density require a higher degree of control of the photolithographic processes to meet more stringent requirements for conductor pattern definition. Spurious reflection of the actinic light from the metal film has a tendency to blur the edges of the patterns being defined. A dyed photoresist can be used to reduce the effects of such reflections, but such compositions are dependent on thickness, shelf life and formulation, and thus do not give dependably uniform results. It has therefore been recognized that a separate antireflection coating should often be included between the metal layer and the photoresist film in integrated circuits made to a high degree of precision.

Various compositions that have been proposed for use as photolithographic antireflection coatings include titanium nitride, titantium-tungsten, silicon nitride and amorphous silicon. We have found that, particularly for use with gallium arsenide integrated circuits using aluminum conductors, these various known antireflection coatings have distinct drawbacks. For example, titanium nitride has a very high stress when coated on aluminum, which may result in adhesion problems and other problems. Silicon coatings tend to react with aluminum and have antireflection properties that are highly dependent on thickness. There is, therefore, a well understood need in the industry for an antireflection coating that is robust in the sense that extreme care in controlling its characteristics need not be made, is chemically consistent with the use of metals such as aluminum and with subsequent device processing steps such as reactive ion etching, is able to adhere well to materials such as aluminum, and whose use is consistent with other processes requirements for making integrated circuits, especially gallium arsenide integrated circuits.

SUMMARY OF THE INVENTION

In accordance with the invention, many advantages and benefits are obtained by using a tungsten silicide composition as the antireflection coating. This coating is preferably formed by sputtering from a tungsten silicide target. As will be explained later, transistor gate electrodes for use in gallium arsenide integrated circuits are often made by sputtering from a tungsten silicide target and so additional equipment is not necessarily required for making the antireflection coating. In a preferred embodiment, the sputtering is done in a nitrogen-containing atmosphere so that the antireflection coating consists of a tungsten silicon nitride composition. It can be shown that this embodiment may have a reflectivity of only about 6% that of aluminum, which is extremely low and is therefore highly effective in reducing reflections.

These and other features, advantages and benefits of the invention will be better understood from a consideration of the following detailed description taken in conjunction with the accompanying drawing.

DETAILED DESCRIPTION

Figure 1:
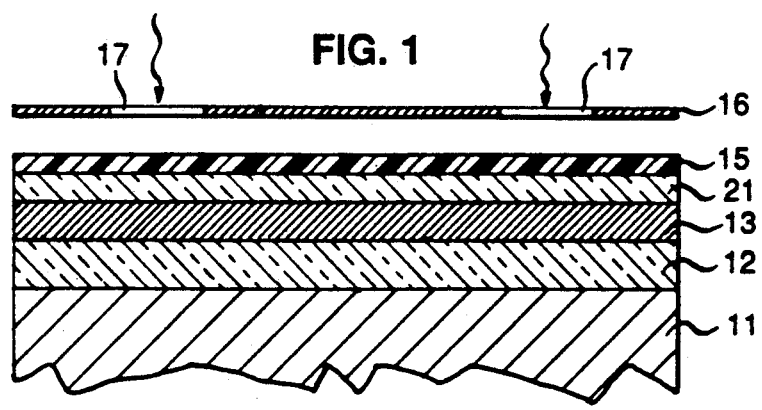
FIGS. 1-4 illustrate successive steps in an illustrative semiconductor photolithographic process in which the invention is used.

Referring now to FIG. 1, there is shown schematically, and not to scale, a semiconductor substrate 11, which may typically be gallium arsenide, upon which it is desired to fabricate an integrated circuit through the use of known photolithographic processes. Overlying the semiconductor substrate is a layer 12 of a dielectric such as silicon oxynitride. Overlying the dielectric layer is a layer of metal such as aluminum from which it is desired to form a conductive pattern. Overlying the metal layer is a layer 15 that is sensitive to actinic light, typically an organic material known as a photoresist. A pattern in the photoresist layer is formed by selectively exposing it to actinic light, indicated schematically by the arrows, through a patterned photomask 16 containing openings 17.

Figure 2:
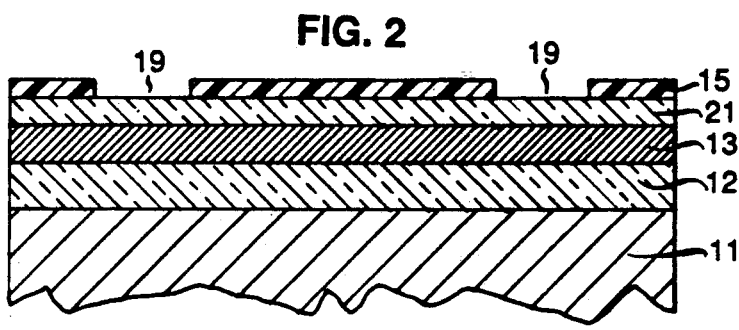

After photographic exposure, the photoresist layer 15 is developed, typically by etching away regions that have been exposed to actinic light, and curing it to leave a final pattern defined by photoresist layer 15 having openings 19 as shown in FIG. 2. The accuracy of the photolithographic process requires that the openings 19 of the photoresist layer 15 of FIG. 2 correspond as closely as possible to the openings 17 in the photomask 16 of FIG. 1. The metal layer 13 of FIG. 1 is typically fairly highly reflective, and as a consequence, light can be reflected from its surface so as to give spurious exposure of portions of photoresist layer 15. This can have the effect of blurring the edges of the openings 19 of FIG. 2 or may result in the regions of the photoresist mask being etched away that have no correspondence to the openings in the photomask. To overcome this problem, it is known in the prior art to include between the metal layer 13 and the photoresist layer 15 an antireflection coating 21, as shown in FIG. 1. It is normally important that such coating have a low reflectivity, and be of a material that adheres well to metal layer 13, is appropriately nonreactive, and has characteristics consistent with the processing steps to which it is subjected.

Figure 3:
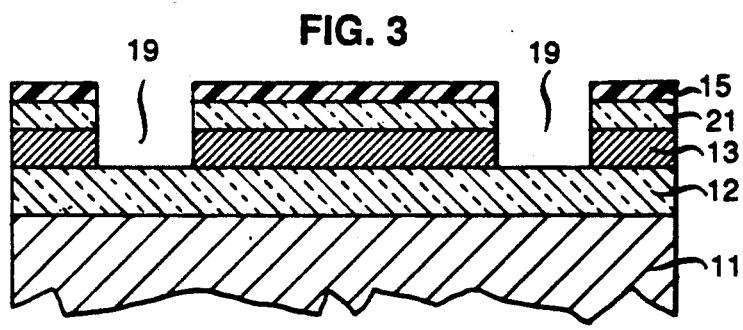

Referring to FIG. 3, the photoresist layer 15 may typically be used as an etch mask which permits etching of the antireflection coating 21 and the metal layer 13 only in regions corresponding to the openings 19. Known reactive ion etch techniques, for example, can be used to selectively etch aluminum without appreciably etching the dielectric layer 12 of silicon oxynitride. After the conductive pattern has been defined in this manner, the photoresist coating 15 is normally etched away so as to leave the structure shown in FIG. 4. It is customary in the prior art also to remove the antireflection coating 21, but as will be explained later, it may be convenient in accordance with the invention to leave the patterned antireflection coating intact.

Figure 5:
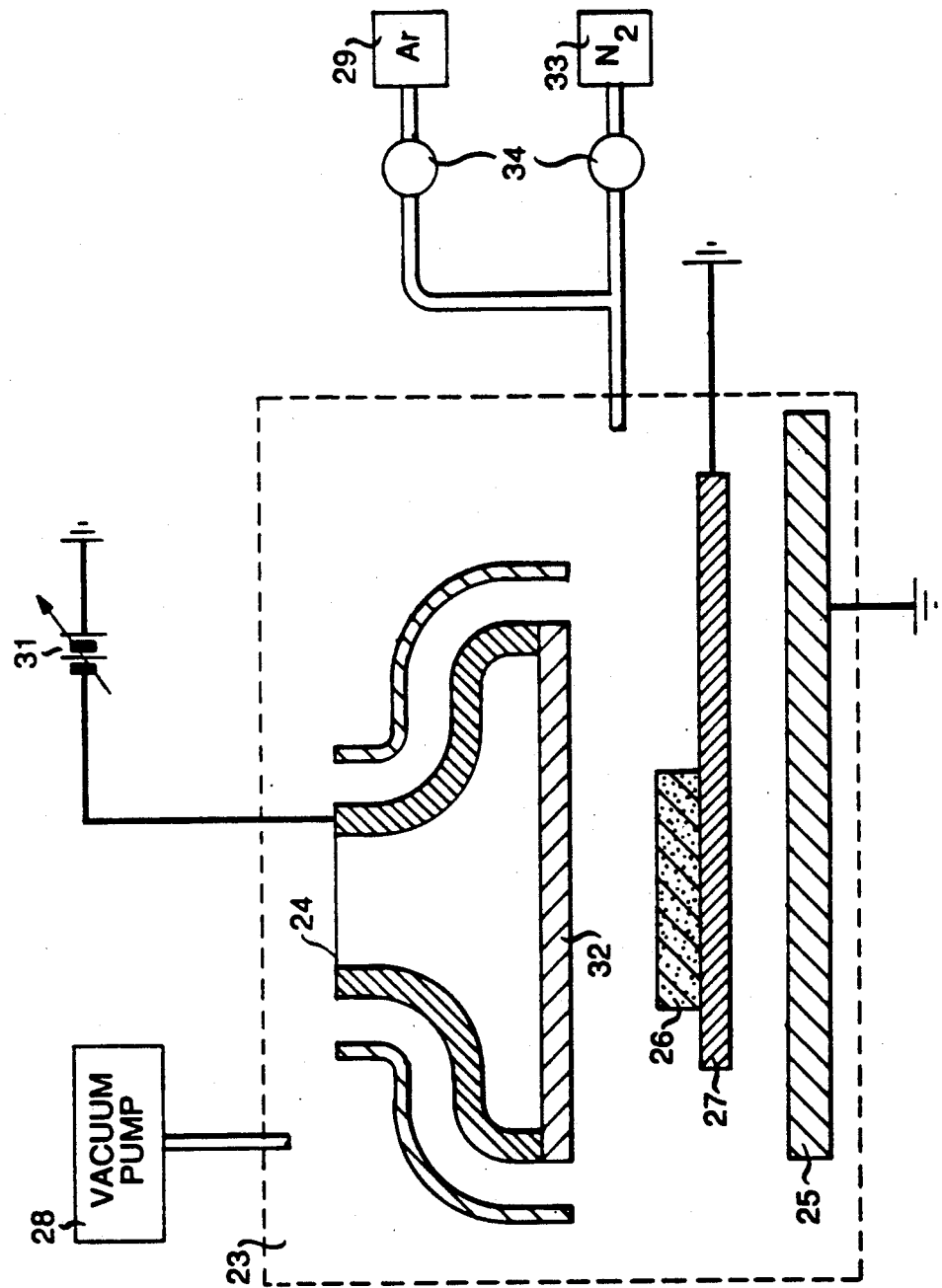
FIG. 5 is a schematic view of sputtering apparatus for depositing an antireflection coating in accordance with one embodiment of the invention.

In accordance with the invention, the antireflection coating 21 is a thin layer of tungsten silicide or a thin layer of tungsten silicon nitride. This layer is preferably deposited by sputtering using known apparatus such as that schematically shown in FIG. 5. FIG. 5 shows schematically a sputtering reactor 23 comprising a cathode 24 and an anode 25. A substrate 26 to be coated is supported by a support structure 27 that is kept at the anode potential. The reactor is evacuated by a vacuum pump 28 and a controlled amount of argon from a source 29 is controllably introduced into the reactor. The cathode is excited by a direct-current (DC) source 31 which creates a plasma between the anode and cathode electrodes. As is known, a radio-frequency (RF) source can alternatively be used. Facing the substrate 26 and at the cathode potential is a target 32 of the material which one desires to deposit. With a low pressure of argon, for example 25.0 microns of mercury, an appropriate DC power will cause positive argon ions to impact the target 32 thereby scattering target material which is coated on the substrate 26. A more complete discussion of modern sputtering techniques are described in the paper "Fundamentals of Sputtering," by A. J. Aronson, *Microelectronic Manufacturing and Testing*, January, 1987, pages 22 and 23 and the paper "Sputtered Metalizations for Hybrid Devices," by R. L. Maniscalco et al., *Hybrid Circuit Technology*, September, 1984, pages 19–23. "Sputtering" is well understood in the art to mean deposition from a plasma due to particle impact on a target, and that is the meaning as used herein.

In accordance with one embodiment of the invention, the target 32 is made of tungsten silicide. With a plasma of pure argon, tungsten silicide having the formula $WSi_{0.45}$ may be deposited to a thickness of from 125–750 angstroms to form the antireflection coating (ARC).

In accordance with another embodiment of the invention, nitrogen from a source 33 is mixed with the argon and injected into the reactor to give a plasma comprising both argon and nitrogen. This results in the deposition of an antireflection coating 21 on substrate 26 of tungsten silicon nitride.

The actual machine that was used in depositing the antireflection coatings in accordance with the invention was a machine known as the MRC 943 sputtering machine which is commercially available from Materials Research Corporation, Orangeburg, N.Y. Valves, schematically designated in FIG. 5 as 34, were used to control the introduction of argon and nitrogen. The parameters for the deposition of various films of $WSi_{0.45}$ and WSiN are given on Table I.

TABLE I

| | | ARC Deposition Parameters | | | | |
|---|---|---|---|---|---|---|
| Material | Target Composition | Power (KW) | Pressure (μm) | % Nitrogen Feed Gas | Rate A/Pass | Sample Speed (cm/min) |
| $WSi_{0.45}$ | 1:1 | 1.0 | 9.0 | 0.0 | 125 | 100 |
| WSiN-G | 1:1 | 1.0 | 25.0 | 20 | 100 | 200 |
| WSiN-HR | 1:1 | 0.3 | 25.0 | 20 | 100 | 100 |

The table gives parameters for two WSiN materials, one deposited at a high DC power and designated WSiN-G, and the other at a lower power and designated WSiN-HR. The "Target Composition" of Table I refers to the ratio of tungsten to silicon in the tungsten silicide target. The "Pressure" in microns of mercury refers to the total gas pressure in the reactor. The "% of Nitrogen" refers to the percent portion of the total gas input that was nitrogen. With the MRC 943 sputtering machine, the substrate was moved transversely to the gas plasma during deposition; the "Rate" refers to the number of angstrom units of material that was deposited with each transversal or "pass" of the substrate through the plasma. The "Sample Speed" refers to the speed in centimeters per minute of the substrate through the plasma.

Figure 6:
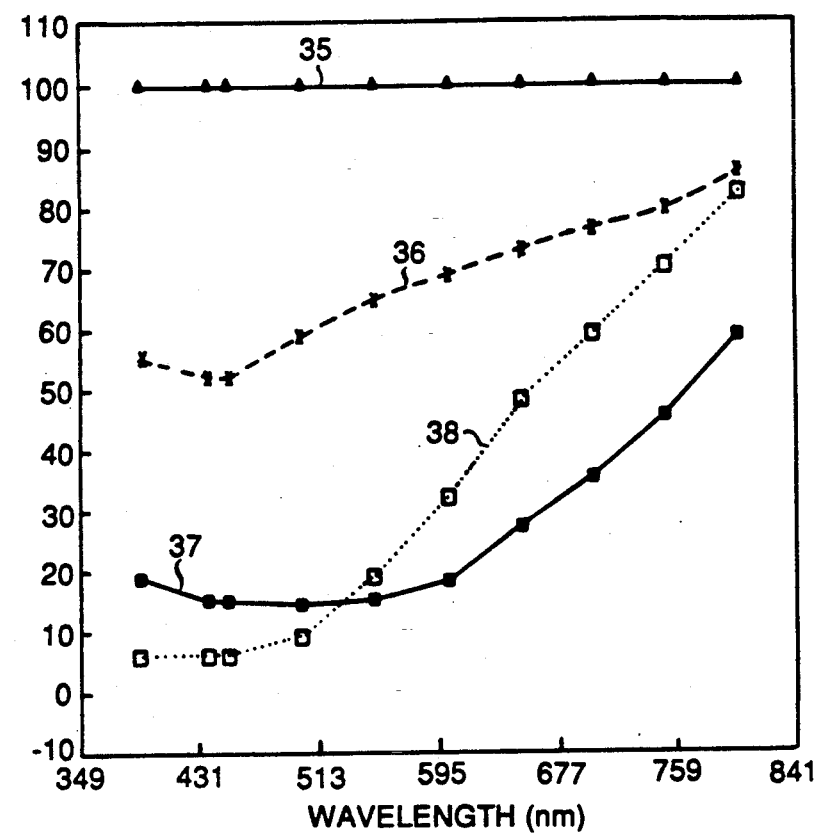
FIG. 6 is a graph of relative reflectivity versus wavelength for various antireflection coatings made in accordance with the invention.

FIG. 6 is a graph of relative reflectivity of different coatings made with the deposition parameters of Table I versus wavelength in nanometers. The relative reflectivity is in terms of the reflectivity with respect to that of aluminum. In other words, the reflectivity of aluminum is taken as being 100%, as is illustrated by curve 35. Curve 36 shows the relative reflectivity of $WSi_{0.45}$ made using the deposition parameters of Table I and coated to a thickness of 250 angstroms. One can see that the reflectivity of this film is between 50 and 70 percent of that of aluminum, thus providing a significant antireflection benefit. Curve 37 shows the relative reflectivity of WSiN-G at a thickness of 300 angstroms. One can see that this offers significantly improved antireflection benefits over that of curve 36. Curve 38 shows the relative reflectivity of WSiN-HR at a thickness of 300 angstroms; it has a reflectivity of only about 6% that of aluminum over a significant wavelength range.

Figure 7:
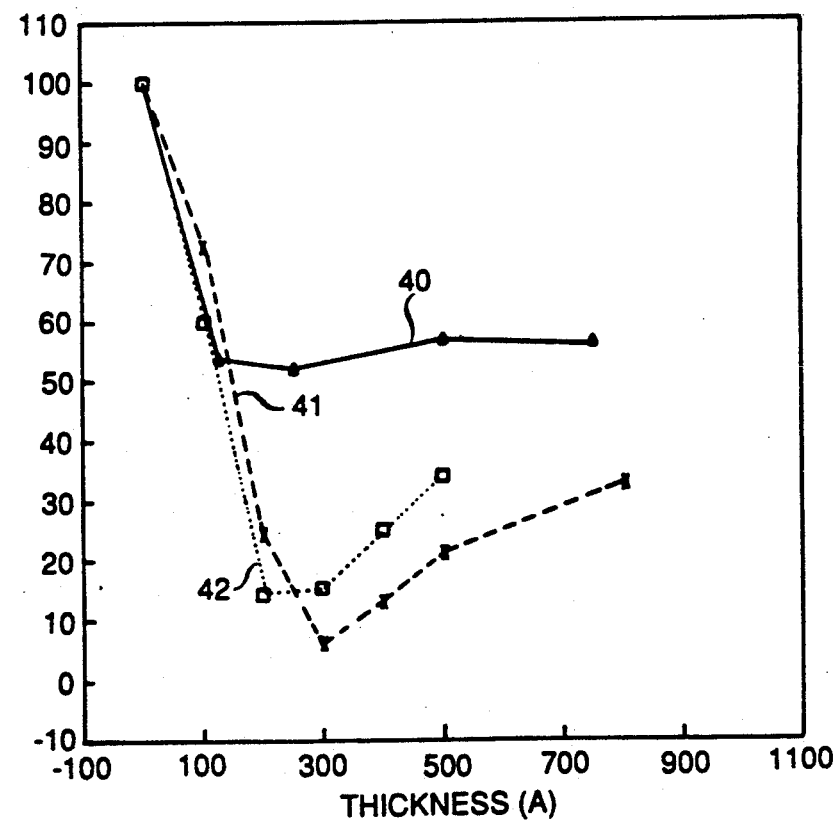
FIG. 7 is a graph of relative reflectivity at 436 nanometers wavelength versus coating thickness for various antireflection coatings made in accordance with the invention.

FIG. 7 shows the variation of relative reflectivity at a wavelength equal to 436 nanometers with respect to film thickness (in Angstrom units) for the three antireflection coatings. Curve 40 is the curve for $WSi_{0.45}$, curve 41 illustrates values for WSiN-HR and curve 42 illustrates reflectivity variations for WSiN-G. One can see that in general, the thickness of the antireflection coating for optimum antireflection benefits is between 125 and 750 angstroms. This illustrates that antireflection coatings made in accordance with the invention are not greatly thickness-dependent.

FIGS. 6 and 7 show that antireflection coatings of $WSi_{0.45}$ give significant benefits but that much greater benefits in terms of lower relative reflectivity are obtained from WSiN. FIG. 7 shows that significant benefits are obtained over a fairly wide range of thicknesses which indicates that extreme care in depositing the proper thickness need not be made. The $WSi_{0.45}$ embodiment has the advantage of not requiring a nitrogen input and the antireflection benefits obtained from it may be acceptable, depending upon the requirements of the process.

The film designated WSiN-G is made by a method which we also use in gallium arsenide integrated circuit production for making WSi gate electrodes for field effect transistor components of the integrated circuits, except that the pressure (25 microns) is higher and the process uses nitrogen which is not used in the gate process. The good antireflection results of this embodiment as indicated by curve 37 of FIG. 6 and curve 42 of FIG. 7 show that in such an integrated circuit process, the same equipment and nearly the same parameters can be used for making the antireflection coating as are used for making the gate electrode, thereby avoiding the need for separate coating apparatus for making the antireflection coating. The parameters for WSiN-HR differ significantly from those for WSiN-G and yet the antireflection properties are also very beneficial. This indicates that careful control of the parameters of the sputtering process is not critical in order to get good antireflection benefits. All of the above considerations point to the fact that the antireflection coating process is a "robust" process step in the making of integrated circuits. All of the coatings have been tested and show good stress characteristics at the interface of aluminum which indicates good long term adhesion to aluminum.

Figure 4:
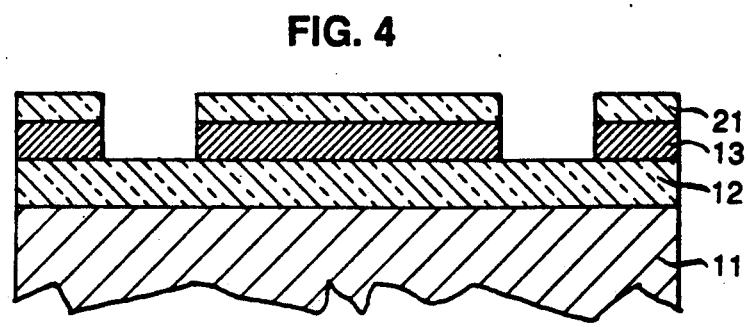

It is known that aluminum is reactive with various semiconductor materials including silicon and is susceptible to a form of deterioration known as electromigration. Referring to FIG. 4, we have found that antireflection coatings 21 made in accordance with the invention also serve as very good protective layers for aluminum conductors 13. They adhere well, prevent electromigration, maintain their properties under conditions of subsequent integrated circuit processing, and they can also serve as protective layers during the long term use of the devices as integrated circuits. Another advantage is that reactive ion etching equipment, which is commonly used for etching the aluminum layer 13, also easily can be used to etch antireflection coating 21 made in accordance with the invention. Still another advantage is that, like the dielectric materials, antireflection coatings made in accordance with the invention can be etched in a $CF_4$ plasma; it may be useful to remove the antireflection coating along with the dielectric in a common plasma to insure good electrical contact to an underlying aluminum layer. For the sake of brevity, these subsidiary processing steps in which the antireflection coatings finds utility will not be reviewed.

The invention was made in the course of the development of gallium arsenide integrated circuit processes and the advantages of the invention in such a context have been described. We believe the invention could be used with other metals such as gold, tantalum and tungsten, which are used in integraged circuit processing, and also as an antireflection coating for bare silicon. The invention appears to be consistent with processes for making integrated circuits from other semiconductor materials such as silicon, indium phosphide and others. The various ARC films can be made by co-sputtering, as is known, from separate tungsten and silicon targets. Also, they can be made by alternately sputtering from separate tungsten and silicon targets; if each layer is sufficiently thin, e.g., less than fifty angstroms, there will be a complete reaction of contiguous layers to form tungsten silicide or tungsten silicon nitride.

Visible light constitutes only one band of the electromagnetic spectrum, and it is to be understood that electromagnetic waves other than visible light may be used to selectively expose the photoresist or other radiation-sensitive material. Various other embodiments and modifications of the invention will be apparent to those skilled from the art without departing from the spirit and scope of the invention.

We claim:

1. A method for making an integrated circuit comprising the steps of: covering a reflective surface of a substrate with an antireflection coating; covering the antireflection coating with a radiation-sensitive material; selectively exposing the radiation-sensitive material to electromagnetic radiation by directing electromagnetic radiation through a patterned mask onto selected regions of the radiation-sensitive material to form a pattern; selectively removing the radiation-sensitive material in accordance with said pattern, thereby to form a patterned mask, characterized in that:

the antireflection coating consists of tungsten silicide having the formula $WSi_{0.45}$.

2. A method for making an integrated circuit comprising the steps of: covering a reflective surface of a substrate with an antireflection coating; covering the antireflection coating with a radiation-sensitive material; selectively exposing the radiation-sensitive material to electromagnetic radiation by directing electromagnetic radiation through a patterned mask onto selected regions of the radiation-sensitive material to form a pattern; selectively removing the radiation-sensitive material in accordance with said pattern, thereby to form a patterned mask, characterized in that:

the antireflection coating is a composition containing tungsten and silicon;

the sputtering step uses a single target comprising tungsten and silicon;

the antireflection coating has a thickness of 125-750 angstrom units.

* * * * *